(12) United States Patent  
Haider et al.

(10) Patent No.: US 7,425,994 B2
(45) Date of Patent: Sep. 16, 2008

(54) VIDEO DECODER WITH DIFFERENT SIGNAL TYPES PROCESSED BY COMMON ANALOG-TO-DIGITAL CONVERTER

(75) Inventors: Towfique Haider, Allen, TX (US); Jason Meiners, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 179 days.

(21) Appl. No.: 11/047,310

(22) Filed: Jan. 31, 2005

(65) Prior Publication Data

US 2006/0170825 A1 Aug. 3, 2006

(51) Int. Cl.
*H03M 1/12* (2006.01)
(52) U.S. Cl. .................... 348/572; 348/708; 341/155
(58) Field of Classification Search ........... 348/572, 348/573, 708, 489–494; 341/155, 161, 162
See application file for complete search history.

(56) References Cited

U.S. PATENT DOCUMENTS

| 4,725,894 | A | * | 2/1988 | Sasaki et al. .................. 386/34 |
| 4,974,058 | A | * | 11/1990 | Takayama .................... 358/530 |
| 5,084,700 | A | * | 1/1992 | Christopher .................. 341/118 |
| 5,627,536 | A | | 5/1997 | Ramirez |
| 5,835,164 | A | * | 11/1998 | Kanai et al. .................. 348/742 |
| 6,448,920 | B1 | | 9/2002 | Webster et al. |

* cited by examiner

*Primary Examiner*—M. Lee
(74) *Attorney, Agent, or Firm*—Wade J. Brady, III; Frederick J. Telecky, Jr.

(57) ABSTRACT

A video decoder (14). The decoder comprises an interface (30) for receiving a set of an integer number S of analog input signals at a same time. The decoder also comprises circuitry for processing the S analog input signals, and that circuitry comprises an integer number N of analog-to-digital converters ($38_x$) for producing a set of the integer number S of digital signals. Each digital signal in the set of S of digital signals corresponds to a respective different one of the S analog input signal, and N is less than S. The decoder also comprises output circuitry ($40_x$, $42_x$), coupled to the circuitry for processing, for providing each digital signal in the set of S of digital signals to a different respective output conductor.

18 Claims, 5 Drawing Sheets

VIDEO DECODER WITH DIFFERENT SIGNAL TYPES PROCESSED BY COMMON ANALOG-TO-DIGITAL CONVERTER

CROSS-REFERENCES TO RELATED APPLICATION

Not Applicable.

STATEMENT REGARDING FEDERALLY SPONSORED RESEARCH OR DEVELOPMENT

Not Applicable.

BACKGROUND OF THE INVENTION

The present embodiments relate to digital video systems and are more specifically directed to video decoders.

Modern high-performance video displays, including plasma and liquid-crystal displays ("LCD"), are adapted to receiving digital signals corresponding to the information to be displayed. These digital signals indicate the intensity, typically by component, to be displayed by each picture element ("pixel") of the display. For example, modern "component" video signals may include a component value for each of the pixel attributes of luma ("Y"), chroma-blue ("Pb"), and chroma-red ("Pr"), where variants of this format also exist (e.g., YUV, YCbCr, and YIQ). As a result, modern high resolution displays, having many pixels in each dimension and with each pixel responsive to as much as a twenty-four bit digital signal, are able to render high fidelity images at real time data rates. Component signals also may be provided in other manners, with a simple approach being RGB, which consists of three signals, red (R), green (G), and blue (B), typically provided by three respective wires.

As known in the art, video inputs are communicated and processed in a wide variety of formats. Broadcast television signals are still communicated in the analog domain, and these analog signals are communicated according to different standards around the world. In addition, video signals from various sources are now also available as inputs for display on digital displays. These other sources include cable and satellite digital video transmissions, video cameras, and video playback devices such as DVD players and video cassette recorders. In any case, these signals may be in a component form of RGB signals or, alternatively, they may be in the form of "composite" video signals, sometimes referred to as CVBS. Various standards also exist in connection with these signals, such as for conventional video signals with standards including the well-known NTSC (National Television Systems Committee), PAL, and SECAM composite video signal standards, and in Europe there is SCART (Syndicat des Constructeurs d'Appareils Radiorécepteurs et Téléviseurs), which combines RGB and CVBS.

Video decoder functions are now commonly used in many high-performance digital display and television systems for receiving video signals from the above-described sources and converting the video signals into a digital form for display. For example, a so-called "set-top box" for receiving cable or satellite digital video transmissions and for driving a digital video display typically includes a video decoder function. Modern set-top boxes also often have auxiliary inputs for receiving video signals from other sources, from which the video decoder in the set-top box generates the digital video output signals. Other systems that include a video decoder function include video decoder cards for personal computers, personal video recorders (PVRs) for digitally recording broadcast, cable, or satellite transmissions for later viewing, digital video projectors, digital VCRs and DVD recorders, video or home theater receivers, and indeed digital television sets including HD television sets and computer displays that are themselves (i.e., without an external set-top box) capable of digitally displaying video output from conventional analog input signals.

The video decoder function in SCART systems has been implemented in the prior art using four different analog-to-digital converters ("ADCs"), where that number of ADCs corresponds to the four signals to be processed. Specifically, to support SCART, four ADCs have been used, with one for the CVBS signal, and three for the respective R, G, and B signals. To illustrate this aspect and for sake of contrast to the preferred embodiments described later, FIG. 1 illustrates a timing diagram of the output of each of these four ADCs, where the first row illustrates the digital output of the ADC receiving an analog input composite signal, thereby showing digital samples $C_0, C_1, \ldots C_6$, while the second through fourth rows illustrate the output of a respective ADC for each of the R, G, and B signals, thereby indicating the digital samples $R_0, R_1, \ldots R_6$ for the analog R signal input, $G_0, G_1, \ldots G_6$ for the analog G signal input, and $B_0, B_1, \ldots B_6$ for the analog B signal input Note also that the illustrated digital signals, per the prior art, are provided at a 2× over-sampling rate, that is, they are sampled at twice the frequency of the analog input signals.

The video decoder function for component signal support has required three different ADCs in the prior art, where that number of ADCs corresponds to the three signals to be processed, as forms of R, G, and B. For example, to support the YPbPr format, three ADCs have been used, with one for each of the respective Y, Pb, and Pr signals. To illustrate this aspect and for sake of contrast to the preferred embodiments described later, FIG. 2 illustrates a timing diagram of the output of each of these three ADCs, where the first row illustrates the digital output of the ADC receiving the Y component signal, thereby showing digital samples $Y_0, Y_1, \ldots Y_9$, while the second row illustrates the digital output of the ADC receiving the Pb component signal, thereby showing digital samples $Pb_0, Pb_1, \ldots Pb_9$, and the third row illustrates the digital output of the ADC receiving the Pr component signal, thereby showing digital samples $Pr_0, Pr_1, \ldots Pr_9$. Note also that the illustrated digital signals, per the prior art, are provided at a 4× over-sampling rate, that is, they are sampled at four times the frequency of the analog input signals.

In connection with the above-described prior art implementations, note that the inclusion of each ADC comes with certain drawbacks. For example, each ADC consumes a significant amount of integrated circuit die size. As a result, device complexity and cost increase with each ADC. Indeed, in a typical video decoder, an 11-bit ADC may consume 10 percent or more in die area. As another example, note from the preceding that typically two different cores are developed for the two different geographic markets of North America and Europe, where one core includes three ADCs (for component signals) and the other includes four ADCs (for SCART). As a result, considerable research and development efforts are multiplied because they are applied differently to one core versus the other. Given these drawabacks as well as others that may be ascertained by one skilled in the art, there arises a need to address the drawbacks of the prior art, as is achieved by the preferred embodiments described below.

BRIEF SUMMARY OF THE INVENTION

In one preferred embodiment, there is a video decoder. The decoder comprises an interface for receiving a set of an integer number S of analog input signals at a same time. The decoder also comprises circuitry for processing the S analog input signals, and that circuitry comprises an integer number N of analog-to-digital converters for producing a set of the integer number S of digital signals. Each digital signal in the set of S of digital signals corresponds to a respective different one of the S analog input signal, and N is less than S. The decoder also comprises output circuitry, coupled to the circuitry for processing, for providing each digital signal in the set of S of digital signals to a different respective output conductor.

Other aspects are also disclosed and claimed.

DETAILED DESCRIPTION OF THE INVENTION

Figure 1:
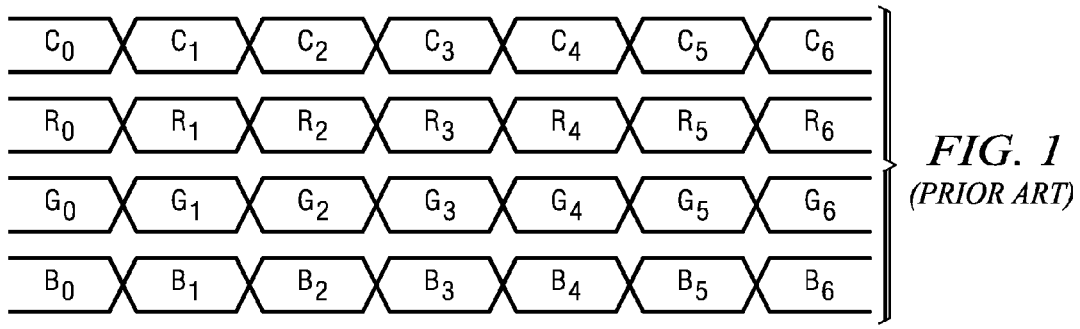
FIG. 1 illustrates a timing diagram of the output of each of four ADCs corresponding to four input signals per the SCART prior art.
Figure 2:
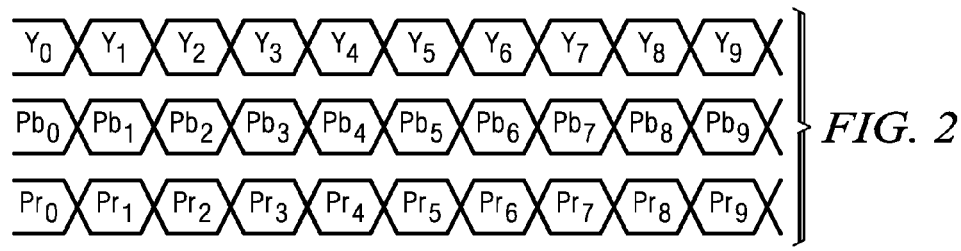
FIG. 2 illustrates a tiring diagram of the output of each of three ADCs corresponding to three input signals per the YPbPr prior art.

The preferred embodiments are described as implemented into a video decoder integrated circuit and with a system utilizing that integrated circuit. However, it is contemplated that this invention may have benefit in applications other than the specific implementation described in this specification. Accordingly, it is to be understood that the following description is provided by way of example only and is not intended to limit the true scope of this invention as claimed. Additionally, FIGS. 1 and 2 are described in the earlier Background Of This Invention section of this document and the reader is assumed familiar with that discussion.

Figure 3:
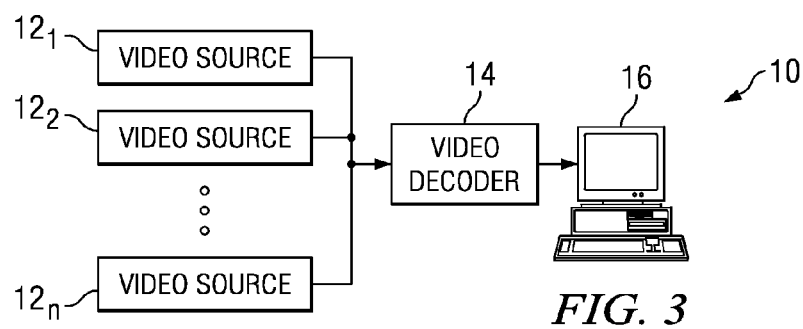
FIG. 3 illustrates a video display system 10 into which the preferred embodiment of the invention may be implemented.

FIG. 3 illustrates a video display system 10 into which the preferred embodiments of the invention may be implemented. In this example, multiple video sources $12_1$ through $12_n$ provide video signals, according to one or multiple different standards or formats, to a video decoder 14. Video decoder 14 decodes the incoming video signals and presents a digital video signal to a video display 16, in a format. Examples of video sources $12_1$ through $12_n$ include conventional video sources such as cable and satellite digital video services, video cameras, video playback devices such as DVD players and video cassette recorders, personal computers, and the like. Examples of the formats of the video signals include both component and composite signals such as those according to the NTSC, PAL, SECAM, and SCART standards. Of course, the system may include any number n of video sources, ranging from a single source to several.

Video decoder 14 as shown in the system of FIG. 3 may be implemented in various parts of the system. For example, video decoder 14 may be implemented within a set-top box, capable of receiving inputs from multiple video sources and delivering digital video signals to display 16. Alternatively, video decoder 14 may be physically implemented within one or more of video sources $12_x$ that are capable of providing digital video signals directly to display 16; an example of this implementation is on the graphics card of a personal computer or workstation. Another example is the incorporation of video decoder 14 within a DVD recorder or playback system, or digital VCR. It is contemplated that these and other arrangements are well-known to those in the art having reference to this specification.

Figure 4A:
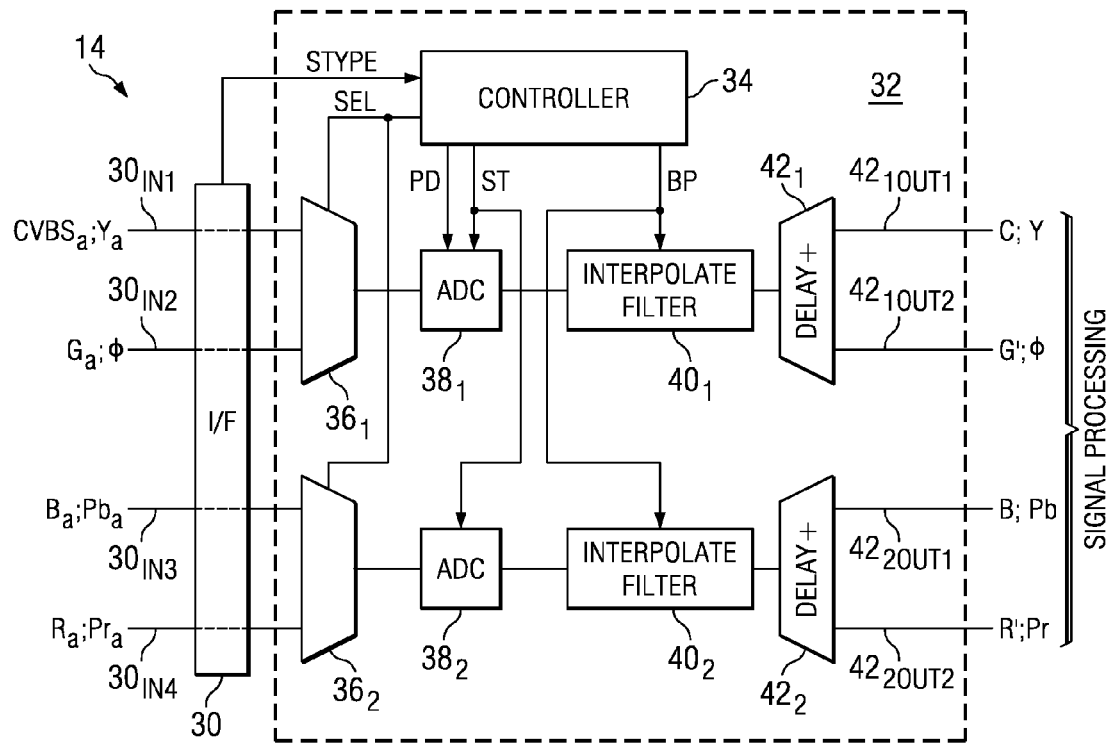
FIG. 4a illustrates a block diagram of the construction of various aspects of video decoder 14 according to a preferred embodiment.

FIG. 4a illustrates a block diagram of the construction of various aspects of video decoder 14 according to a preferred embodiment. An input interface 30 receives a plurality of analog input video signals at respective inputs $30_{IN1}$ through $30_{IN4}$ where, as detailed below, in the preferred embodiments the plurality of signals may include either three or four signals, depending on the type of video source (e.g., any of video sources $12_x$ of FIG. 3). For example, in a SCART application, interface 30 receives four analog signals, each shown with a subscript of "a" to denote their analog nature, namely, $CVBS_a$, $R_a$, $G_a$, and $B_a$. As another example, in an RGB application, interface 30 receives three analog signals, $R_a$, $G_a$, and $B_a$. As a final example, in a component application, interface 30 receives three signals, shown by example as $Y_a$, $Pb_a$, and $Pr_a$. For sake of convention in FIG. 4a, the SCART and component applications are shown, with the different sets of inputs separated by a semicolon; for example, input $30_{IN1}$ is shown to receive the $CVBS_a$ signal for the SCART application and the $Y_a$ signal for the component application. Also, for reasons more evident below, in the component application, a null symbol, $\phi$, is shown at input $30_{IN2}$ to indicate that no video signal is received in that instance since the total of the three component signals are instead provided to inputs $30_{IN1}$, $30_{IN3}$, and $30_{IN4}$. In general, interface 30 buffers and level-converts the input video signals in the conventional manner, according to the nature of the signals received and the requirements of downstream functions within video decoder 14. The input video signals are then applied to an analog front-end 32, which is further detailed below.

Analog front-end 32 includes a controller 34 that controls various functions shown as blocks within front-end 32, where those functions and controller 34 may be constructed according to one skilled in the art to perform consistent with the teachings herein. In this regard, controller 34 receives a signal STYPE, such as from interface 30, that indicates the type of signals then being input to interface 30. For example, STYPE may indicate that the input signals are SCART signals (i.e., CVBS, R, G, B), only RGB signals, or component signals (e.g., Y, Pb, Pr). In response, controller 34 issues numerous control signals to various functions within front-end 32. As one example, controller 34 provides a select signal, SEL, to control two two-input multiplexers $36_1$ and $36_2$. Multiplexer $36_1$ has a first input connected to receive the interface-processed signal corresponding to input $30_{IN1}$ and a second input connected to receive the interface-processed signal corresponding to input $30_{IN2}$. Similarly, multiplexer $36_2$ has a first input connected to receive the interface-processed signal corresponding to input $30_{IN3}$ and a second input connected to receive the interface-processed signal corresponding to input $30_{IN4}$. The output of multiplexer $36_1$ is connected as an input to an analog-to-digital converter ("ADC") $38_1$, and the output of multiplexer $36_2$ is connected as an input to ADC $38_2$. Both ADC $38_1$ and ADC $38_2$ receive a sample time control signal, ST, from controller 34, to thereby indicate the rate at which each ADC samples its respective input. Additionally, ADC $38_1$ receives a path disable control signal, PD, to selectively disable the conversion signal path for certain instances, detailed later. Lastly, controller 34 is shown to provide a bypass signal, BP, to an interpolate/decimate filter $40_1$ and an interpolate/decimate filter $40_2$. The bypass signal, BP, permits those interpolate/decimate filters $40_1$ and $40_2$ to bypass their functionality with respect to a received digital input, where such a bypass functionality is desired in certain instances as further described below.

The remaining blocks and connectivity of decoder 14 shown in FIG. 4a are now discussed. Looking to interpolate/decimate filter $40_1$ and interpolate/decimate filter. $40_2$, each interpolate/decimate filter $40_1$ and $40_2$ has its input connected to the output of a respective one of ADC $38_1$ and $38_2$. As detailed later, each filter $40_x$ is operable to interpolate between two successive digital sample values in a data stream (not necessarily immediately successive from one another), from a respective ADC $38_x$ and corresponding to a same input signal, and to thereby provide an interpolated value as between those two successive digital values; in addition, each filter $40_x$ is also operable to perform a decimation function whereby after it obtains the interpolated value it discards or removes from the data stream the two successive digital values from which the interpolated value was determined. Accordingly, for that signal being interpolated, each filter $40_x$ only outputs the interpolated values rather than those values from which the interpolated values are determined. Moreover, as introduced above, each interpolate/decimate filter $40_x$, in response to the bypass signal BP, may bypass these interpolate/decimate functions when desirable. Thus, the output of each filter $40_x$ provides a sequence of digital values, corresponding to its inputs, where some of those output values are interpolated values when the interpolation/decimate functions are applied, while other output values are merely a pass-through of one or more input values when the interpolate/decimate functions are bypassed. The output of each filter $40_1$ and $40_2$ is connected as an input to a respective de-multiplexer and delay unit $42_1$ and $42_2$. The outputs of units $42_1$ and $42_2$ are detailed below, and at this point note that they are connected to additional signal processing circuitry within decoder 14, where such circuitry is neither shown nor described so as to focus the discussion herein on certain inventive aspects. However, such additional circuitry may be ascertained by one skilled in the art and may include, by ways of example, front-end gain control, formatting, filtering, back-end gain control, and output formatting.

By way of additional introduction to the operation of decoder 14, attention is directed to the operation and particular outputs of de-multiplexer and delay units $42_1$ and $42_2$. Each de-multiplexer and delay until $42_x$ receives a sequence of digital inputs and, in response, operates to delay the sequence so that two successively received input digital values may be output on different outputs at a same time and thereby aligned in time. For example, if the input sequence to a de-multiplexer and delay until $42_x$ is a digital value $D_0$ followed in time by a digital value $D_1$, then that unit imparts a delay on the sequence, until $D_1$ is sufficiently received, and then outputs at the same time $D_0$ and $D_1$ on its respective two outputs. Looking more specifically to FIG. 4a, then, for de-multiplexer and delay unit $42_1$, it provides, when operating with respect to SCART signals, a digital value C on an output $42_{1OUT1}$, corresponding to the analog $CVBS_a$ signal that was input to interface 30 via input $30_{IN1}$; at the same time, unit $42_1$ outputs in time-aligned fashion a digital value G' on an output $42_{1OUT2}$, corresponding to the analog $G_a$ signal that was input to interface 30 via input $30_{IN2}$. The apostrophe on signal G' is included by way of depicting certain functions as applied to that signal as described later. Similarly, with respect to unit $42_2$ and also at the same time, it provides, when operating with respect to SCART signals, a digital value B on an output $42_{2OUT1}$, corresponding to the analog $B_a$ signal that was input to interface 30 via input $30_{IN3}$, while unit $42_2$ also outputs in time-aligned fashion a digital value R' on an output $42_{2OUT2}$, corresponding to the analog $R_a$ signal that was input to interface 30 via input $30_{IN4}$. Similarly, but considering now the instance of component signals processed by decoder 14, de-multiplexer and delay until $42_1$ provides a digital value Y on output $42_{1OUT1}$, corresponding to the analog $Y_a$ signal that was input to interface 30 via input $30_{IN1}$; at the same time, unit $42_1$ provides no output on output $42_{1OUT2}$, thereby illustrated again as the null symbol, $\phi$, and corresponding to the aspect that for component signals, no component signal is input to input $30_{IN2}$. With respect to unit $42_2$ and also at the same time, it provides, when operating with respect to component signals, a digital value Pb on output $42_{2OUT1}$, corresponding to the analog $Pb_a$ signal that was input to interface 30 via input $30_{IN3}$, while unit $42_2$ also outputs in time-aligned fashion a digital value Pr' on output $42_{2OUT2}$, corresponding to the analog $Pr_a$ signal that was input to interface 30 via input $30_{IN4}$. The apostrophe convention of G', above, is also used with Pr', for reasons detailed later.

FIG. 4b again illustrates decoder 14 of FIG. 4a, with the only changes in the illustration being particular signals depicted in FIG. 4b so as to demonstrate the operation of decoder 14 with respect to SCART signals. Thus, to the left of FIG. 4b and as input to interface 30, only the SCART analog signals, $CVBS_a$, $G_a$, $B_a$, and $R_a$, are shown connected to respective inputs $30_{IN1}$, $30_{IN2}$, $30_{IN3}$, and $30_{IN4}$. These signals are processed by decoder 14 as detailed below, with this discussion also being facilitated by the timing diagrams of FIGS. 5 through 7, where those Figures also are discussed below.

Figure 4B:
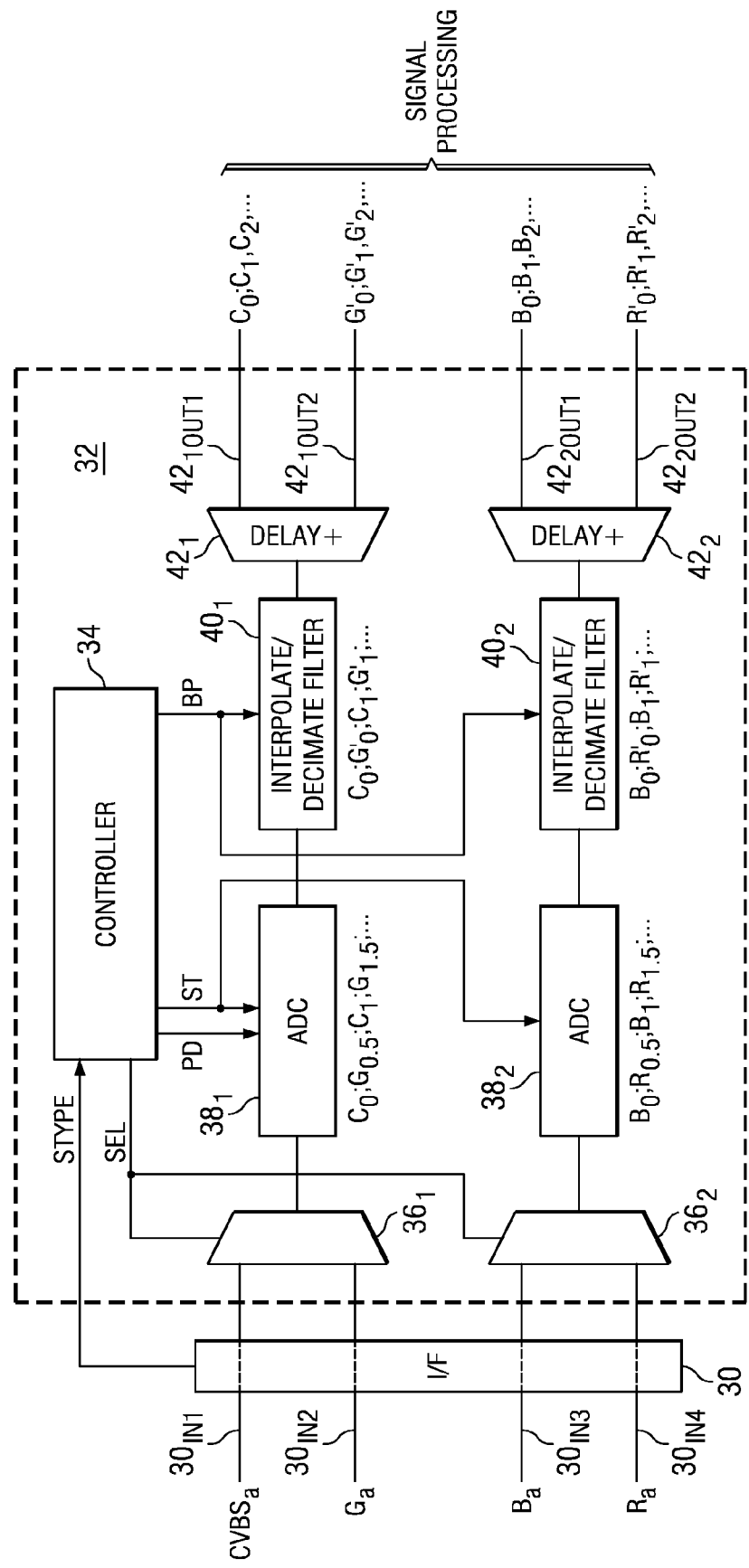
FIG. 4b again illustrates decoder 14 of FIG. 4a, with changes to demonstrate the operation of decoder 14 with respect to SCART signals.

The operation of decoder 14 in FIG. 4b commences with the sampling of inputs by each respective one of multiplexers $36_1$ and $36_2$. Thus, controller 34 indicates desired frequency via the SEL signal so as to cause selection at that frequency by each of multiplexers $36_1$ and $36_2$. In a preferred embodiment, when SCART signals are input to interface 30, as in the example of FIG. 4b, controller 34 is so informed by the STYPE signal and, in response, controller 34 asserts SEL so as to oversample the inputs to interface 30 at a 4× oversampling rate. Looking to multiplexer $36_1$ by way of example in this regard, it samples $CVBS_a$ and then next samples $G_a$, continuously repeating this cycle to again sample $CVBS_a$ and then $G_a$, and so forth, with each of these samples being output to ADC $38_1$. In a comparable manner and looking to multiplexer $36_2$, it samples $B_a$ and then next samples $R_a$, continuously repeating this cycle to again sample $B_a$ and then $R_a$, and so forth, with each of these samples being output to ADC $38_2$.

Figure 5:
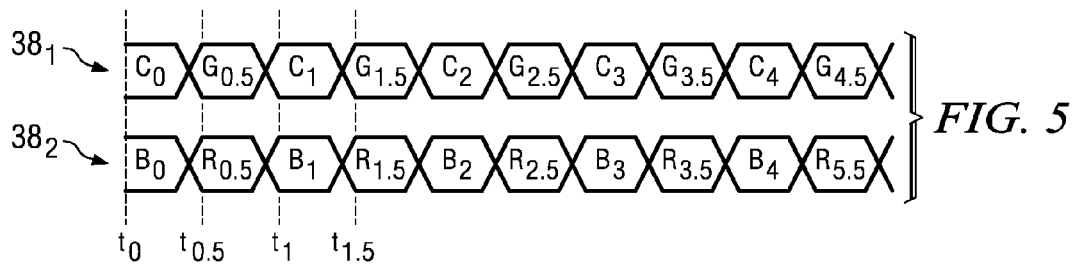
FIG. 5 illustrates a timing diagram of the output of ADC $38_1$ and the output of ADC $38_2$ of FIG. 4b.

In response to the sampling of multiplexers $36_1$ and $36_2$ and according to the sample time signal, ST, provided by controller 34, each respective ADC $38_1$ and $38_2$ converts each input sample to a corresponding digital value, as is now also shown in connection with FIG. 5. Specifically, FIG. 5 illustrates a timing diagram of the output of ADC $38_1$ and the output of ADC $38_2$ with respect to the operation of decoder 14 of FIG. 4b. Looking by way of example at the output of ADC $38_1$, it follows the back and forth sampling pattern between signals C (shortened from "CVBS" for simplicity) and G, where the "a" subscript is now dropped as those values have been converted from analog to digital. Note, however, that a new subscript convention is added for reasons now introduced and further explored below. Particularly, consider that the first conversion of a sample of $CVBS_a$ occurs at a time $t_0$; accordingly, the same "0" subscript for that time is added to the corresponding digital sample counterpart, $C_0$. However, recall that SEL causes oversampling at a rate of 4×, and recall further from the Background Of The Invention section of this document that the FIG. 1 prior art approach (one ADC per signal) is performed at an oversampling rate of 2×; in contrast, in the preferred embodiment, the sampling rate is doubled. As a result, following the sampling of $CVBS_a$ at time $t_0$, then at a point half-way between that time $t_0$ and the time $t_1$ when $CVBS_a$ is next sampled, $G_a$ is sampled; thus, this half-way point may be designated as time $t_{0.5}$, that is, the midpoint in time between $t_0$ and $t_1$. In other words, $G_a$ is sampled at a same frequency, but at an absolute time that is delayed by one-half of the period of that frequency relative to $CVBS_a$. Accordingly, the corresponding digital outputs of ADC $38_1$ will reflect this delay. Given these observations and conventions, in FIG. 5, following the digital value $C_0$, there is a digital value $G_{0.5}$. This pattern repeats, whereby at time $t_1$ the sample of $CVBS_a$ is converted by ADC $38_1$ to create $C_1$, and at a time of one-half the oversampling period later, namely at time $t_{1.5}$, the sample of $G_a$ is converted by ADC $38_1$ to create $G_{1.5}$. These few examples are shown under ADC $38_1$ in FIG. 4b, and this pattern is repeated through the entire sequence of samples shown in FIG. 5 with respect to ADC $38_1$.

Figure 6:
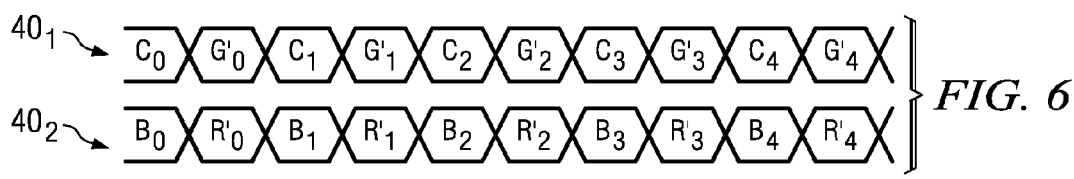
FIG. 6 illustrates a timing diagram of the output of units $40_1$ and $40_2$ of FIG. 4b.

Continuing with the operation of decoder 14 in FIG. 4b, attention is now turned to interpolate/decimate filters $40_1$ and $40_2$. Recall from above that their functionality is introduced in that they interpolate between two successive digital values and decimate by thereafter discarding, or removing from the data stream, the two successive digital values from which the interpolated value was determined. By way of example with respect to filter $40_1$, it performs this function with respect to the G signals it receives from ADC $38_1$. For example, for two successive signals of the same type, such as G signals $G_{0.5}$ and $G_{1.5}$, filter $40_1$ determines an interpolated value estimated to occur in time half-way between them, which is designated in this document and its Figures by adding an apostrophe to the signal name and also using a subscript half-way between those of the two successive signals; hence, in the present example, the value interpolated between $G_{0.5}$ and $G_{1.5}$ is $G'_1$. Thereafter, filter $40_1$ decimates and thereby removes $G_{0.5}$ and $G_{1.5}$ from the data stream, while including $G'_1$ in the data stream. In addition to this operation, note, however, that filter $40_1$ does not perform these steps with respect to the signal C and its values $C_0$, $C_1$, $C_2$, and so forth. The avoidance of these operations may be achieved by controller 34 asserting its bypass signal, BP, at the appropriate time so that the C signal values bypass the functionality of filter $40_1$. Other mechanisms, such as re-routing these signals, also may be implemented as ascertainable by one skilled in the art. In any event, therefore, with the C signal values from ADC $38_1$ unchanged and the interpolation with respect to the $G_{x.5}$ signals, then the resulting digital values output by filter $40_1$ take the form of $C_0$, $G'_0$, $C_1$, $G'_1$, and so forth. These few examples are shown under filter $40_1$ in FIG. 4b; additionally, FIG. 6 illustrates a timing diagram of the output of filters $40_1$ and $40_2$ of FIG. 4b and, thus, in the first row this pattern is shown and is repeated through the entire illustrated sequence of samples shown. FIG. 6 also illustrates the corresponding output of filter $40_2$. Filter $40_2$ operates in a manner comparable to filter $40_1$, but filter $40_2$ operates with respect to the digital signals B and R from ADC $38_2$. In this regard, filter $40_2$ bypasses any operation with respect to the B signals, but interpolates and decimates with respect to the R signals. Consequently, the resulting digital values output by filter $40_2$ take the form as shown in FIG. 6, namely, $B_0$, $R'_0$, $B_1$, $R'_1$, and so forth. These few examples are shown under filter $40_2$ in FIG. 4b, and this pattern is repeated through the entire sequence of samples shown in FIG. 6 with respect to filter $40_2$. Lastly, given the preceding discussion of filters $40_1$ and $40_2$, note that they may be implemented in various fashions as ascertainable by one skilled in the art, including as so-called co-siting filters, as are known in the art.

Figure 7:
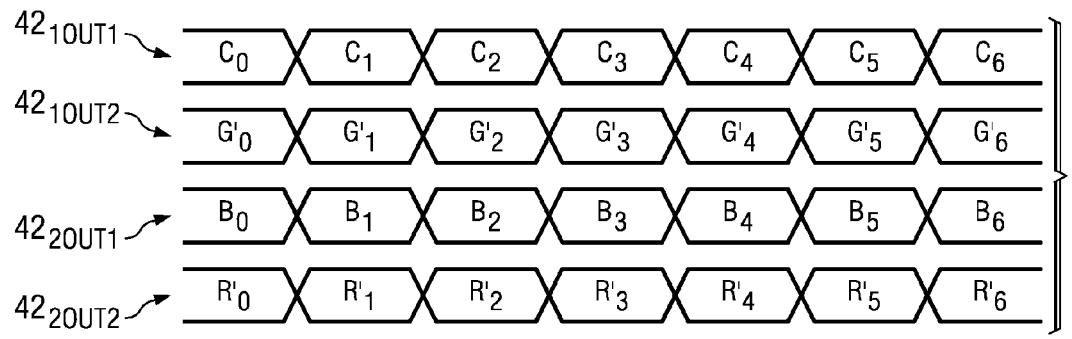
FIG. 7 illustrates a timing diagram of the output of units $42_1$ and $42_2$ in FIG. 4b.

Continuing with the operation of decoder 14 in FIG. 4b, attention is now turned to de-multiplexer and delay units $42_1$ and $42_2$. Each unit $42_x$ is operable to receive a digital stream of inputs and to toggle its input to one of its outputs so that every other input, or in this case every sample corresponding to a same signal, is coupled to a same output. Thus, looking by way of example to the stream $C_0$, $G'_0$, $C_1$, $G'_1$, ..., as input to unit $42_1$, unit $42_1$ connects the first input value $C_0$ to its first output $42_{1\ OUT1}$, toggling to connect the second input value $G'_0$ to its second output $42_{1\ OUT2}$, toggling to connect the third input value $C_1$ to its first output $42_{1\ OUT1}$, toggling to connect the fourth input value $G'_1$ to its second output $42_{1\ OUT2}$, and so forth. Accordingly, the C-related signals are provided at output $42_{1\ OUT1}$ and the G'-related signals are provided at output $42_{1\ OUT2}$, as shown in FIG. 4b. In addition, however, note that the delay aspect of each unit $42_x$ is used to align each pair of outputs in time, as is now explained also in connection with FIG. 7. Specifically, the first two rows of FIG. 7 illustrate outputs $42_{1\ OUT1}$ and $42_{1\ OUT2}$ of unit $42_1$ in FIG. 4b. Note that the just-described toggling effect is shown in those two rows with output $42_{1\ OUT1}$ providing C-related signals and output $42_{1\ OUT2}$ providing G'-related signals. In addition, however, note that $C_0$ provided at output $42_{1\ OUT1}$ is time-aligned with $G'_0$ provided at output $42_{1\ OUT2}$ which is achieved by delaying the output of the former until the latter value is available. Using this delay, this pattern continues, so that the C-related signal outputs are continuously provided at output $42_{1\ OUT1}$, while at the same time the respective G'-related signal outputs are provided continuously and time-aligned at output $42_{1\ OUT2}$. From the preceding, therefore, note now that the C-related signals are time-aligned with the G'-related signals, which recall are interpolated values of G that correspond to the same timing (e.g., $t_0$, $t_1$, $t_2$, ...) of the C-related signals. Unit $42_2$ operates in a comparable manner with respect to its input stream of digital signal stream $B_0$, $R'_0$, $B_1$, $R'_1$, ...; thus, as shown in FIG. 4b, the B-related signals are provided at output $42_{2\ OUT1}$ and the R'-related signals are provided at output $42_{2\ OUT2}$. Moreover, unit $42_2$ also imposes a delay in the same manner as unit $42_1$ and, thus, as shown in the third and fourth rows of FIG. 7, the B-related signals are time-aligned with the R'-related signals, which recall are interpolated values of R that correspond to the same timing (e.g., $t_0$, $t_1$, $t_2$, . . . ) of the B-related signals.

Having detailed the operation of decoder 14 of a preferred embodiment with respect to SCART signal inputs, comparisons now may be made between the preferred embodiment and the prior art. As one observation, note the timing diagrams of the prior art approach of FIG. 1 and that of the preferred embodiment of FIG. 7. In both instances, four digital output signals are provided, one corresponding to each of the four SCART input analog signals. However, recall that the prior art requires a separate ADC for each of the four inputs; in contrast, as has been shown in FIGS. 4a and 4b, the preferred embodiment processes multiple different analog signals through a single ADC. For example, ADC $38_1$ processes the different analog signals $CVBS_a$ and $G_a$, and as another example, ADC $38_2$ processes the different analog signals $B_a$ and $R_a$. Consequently, the preferred embodiment uses less ADCs than the total number of video input signals to be decoded; indeed, in the preferred embodiment SCART implementation, one-half the number of ADCs are used as compared to the prior art. Thus, less room is consumed on the integrated circuit die due to the reduction in the number of ADCs. Also in regard to the reduction of device size, it is noted that size is needed on the die to accommodate filters $40_x$ and multiplexers $42_x$. However, filters $40_x$ filters may be significantly smaller compared to ADC die size because an actual application may tolerate some amount of filter noise without sacrificing any noticeable device performance degradation and hence the filter may include fewer taps. Additionally, the size of multiplexers $42_x$ is considerably insignificant. Thus, overall device size may be reduced as compared to the prior art. Moreover, as further demonstrated below, the preferred embodiment approach may be used for formats other than SCART and, indeed, may be implemented in a single device that may at some times accommodates SCART while at other times accommodates either component or RGB signals.

Figure 8:
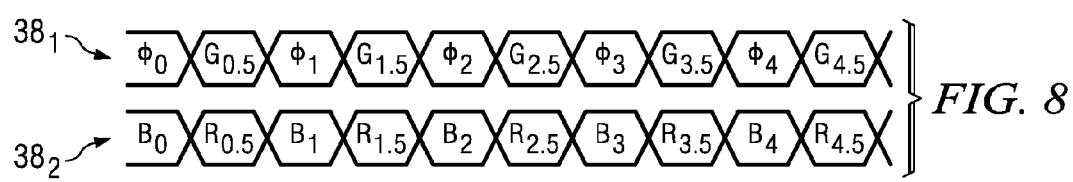
FIG. 8 illustrates a timing diagram of the output of ADC $38_1$ and the output of ADC $38_2$ of FIG. 4a when connected to process RGB signals.
Figure 9:
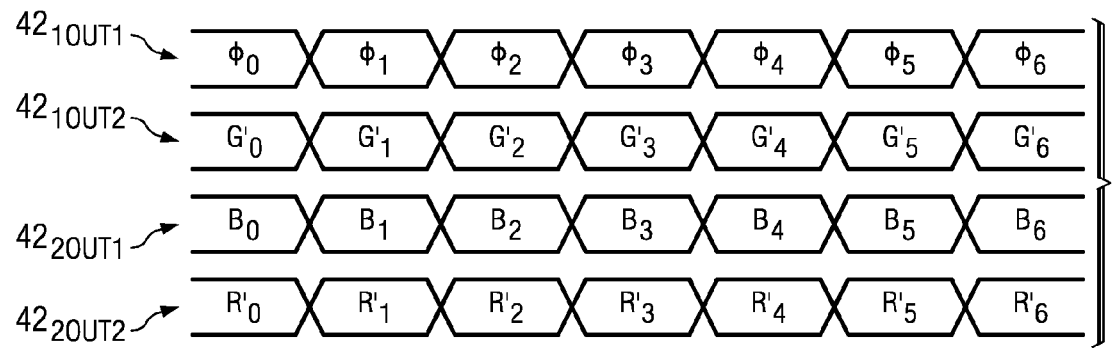
FIG. 9 illustrates a timing diagram of the output of units $42_1$ and $42_2$ when connected to process RGB signals.

Having described decoder 14 and its operation with respect to SCART signals, note now that it also may operate with respect to standard RGB signals. Particularly, referring again to FIG. 4b, such operation may be achieved by connecting the $R_a$, $G_a$, and $B_a$ signals as shown, with no connection to input $30_{IN1}$. Thus, every other sample from multiplexer $36_1$ will be a null, or irrelevant, sample and may be disregarded or ignored. To achieve this aspect, controller 34 asserts the path disable, PD, signal, to ADC $38_1$. This is shown to demonstrate that ADC $38_1$ may be disabled from converting these null signals, or they may be converted and merely disregarded when output. Toward this end, FIG. 8 illustrates a timing diagram of the outputs of ADCs $38_1$ and $38_2$ for RGB analog conversion. In its first row, FIG. 8 illustrates the outputs of multiplexer $38_1$, and it may be seen that every other output is designated as null (i.e., φ) to indicate that such data need not be processed and nor is it needed. Additionally, note that the second row of FIG. 8, which illustrates the outputs of multiplexer $38_2$, is identical to that of FIG. 5 in that the same operations occur with respect to the $R_a$ and $B_a$ signals. From the preceding, therefore, one skilled in the art should appreciate that the FIG. 8 signals may therefore be processed in the same manner as described above with respect to the SCART signals, where the null signals are continuously ignored or disregarded. As a result, the outputs of decoder 14 will be as shown in FIG. 9, which illustrates the outputs of units $42_1$ and $42_2$ when operating with respect to RBG signals. From that Figure, it may be seen that outputs $42_{1OUT2}$, $42_{2OUT1}$, and $42_{2OUT2}$ are identical to that of FIG. 7 and, thus provide the G', B, and R' signals, respectively. Moreover, output $42_{1OUT1}$ is merely disregarded for this RGB application. Alternatively, note that the inputs may be rearranged to decoder 14 with the appropriate control so that two of the three output signals represent direct sampled values rather than interpolated ones, where implementing such an alteration may be readily accomplished by one skilled in the art.

FIG. 4c again illustrates decoder 14 of FIG. 4a, with changes to demonstrate the operation of decoder 14 with respect to receiving component signals at interface 30, again as indicated to controller 34 by the STYPE signal. Thus, to the left of FIG. 4c and as input to interface 30, only the component analog signals, $Y_a$, $Pb_a$, and $Pr_a$, are shown connected to respective inputs $30_{IN1}$, $30_{IN3}$, and $30_{IN4}$. This leaves input $30_{IN2}$ without an input signal and, thus, such an instance is again shown by the null symbol. The $Y_a$, $Pb_a$, and $Pr_a$ signals are processed by decoder 14 mostly in a manner comparable to that described above with respect to the SCART signals and, thus, less detail is provided below as the reader is assumed familiar with the earlier discussion. However, to the extent that differences exist, they are explored below.

Figure 4C:
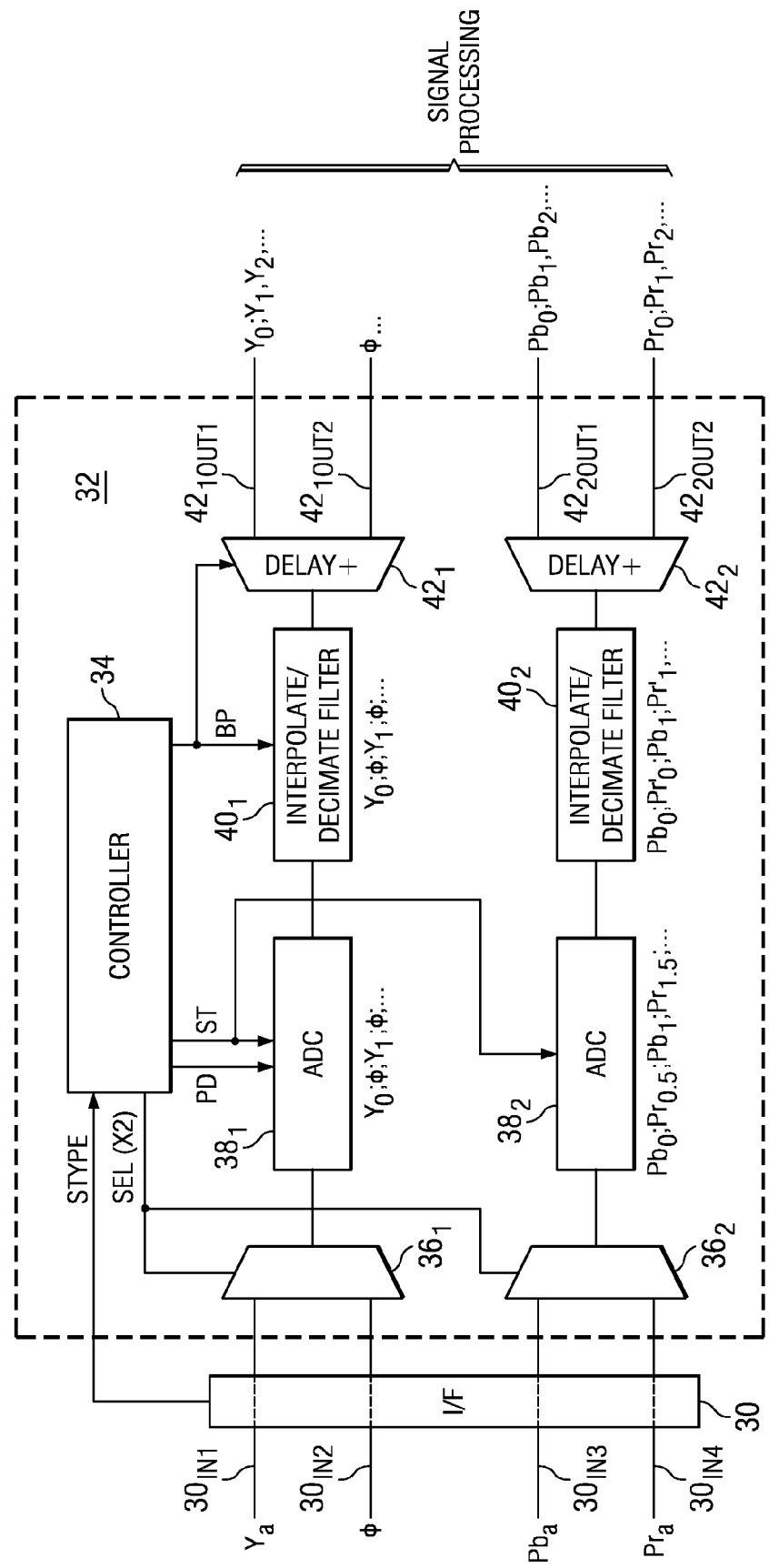
FIG. 4c again illustrates decoder 14 of FIG. 4a, with changes to demonstrate the operation of decoder 14 with respect to component signals.
Figure 10:
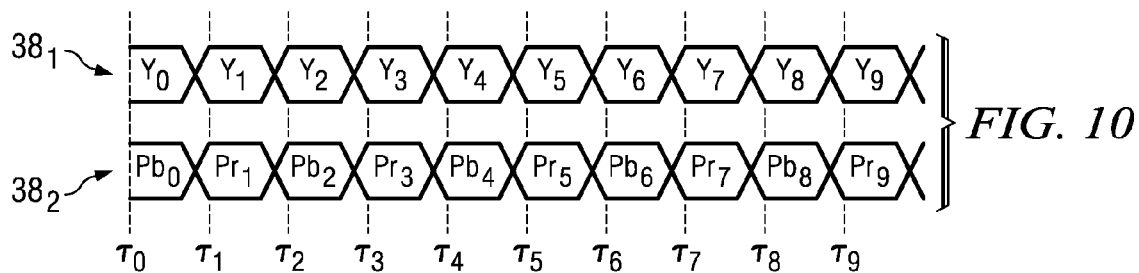
FIG. 10 illustrates a timing diagram of the output of ADC $38_1$ and the output of ADC $38_2$ when connected to process YPbPr signals and relative to the operation of FIG. 4c.

Turning now to a difference in operation of decoder 14 of FIG. 4c with respect to component signals as compared to that of FIG. 4b with respect to SCART (or RGB) signals, in the preferred embodiment in FIG. 4c controller 34 asserts the select signal SEL to cause a 2× sampling rate that is relative to the Y signal, rather than a 4× rate, so as to operate the multiplexers $36_x$ and ADCs $38_x$. Specifically, it is observed in connection with the preferred embodiments that the Pb and Pr signals have a frequency bandwidth that is slightly less than one-half of the Y signal, namely, typically the bandwidth of Y is on the order of 6.75 MHz while the bandwidth of the Pb and Pr signals is on the order of 3.3 MHz. As a result, note therefore that for every sampling of the Y signal relative to its bandwidth, the Pb and Pr signals may be sampled at one half that rate with approximately the same resulting efficiency due to their smaller bandwidth. Returning then to the SEL signal, it causes the Y signal causes 2× sampling of the Y signal by multiplexer $38_1$, while that same clock speed as applied to multiplexer $38_2$ causes approximately 1× sampling relative to the Pb and Pr signals, which is sufficient for purposes of obtaining values of those signals which are then converted to digital form by ADC $38_2$. To further illustrate this aspect, FIG. 10 illustrates a timing diagram of the output of ADC $38_1$ and the output of ADC $38_2$ relative to the operation of FIG. 4c. Following a time $t_0$, multiplexer $38_1$ samples $Y_a$ which is converted by ADC $38_1$ to produce a corresponding sample $Y_0$, while at the same time multiplexer $38_2$ samples $Pb_a$ which is converted by ADC $38_2$ to produce a corresponding sample $Pb_0$. Next, following a time t1, multiplexer $38_1$ again samples $Y_a$ which is converted by ADC $38_1$ to produce a corresponding sample $Y_1$, but at this same time multiplexer $38_2$ now samples $Pr_a$ which is converted by ADC $38_2$ to produce a corresponding sample $Pr_1$. This process continuously repeats and, thus, the sequence along the first row of FIG. 10 illustrates a different sample of Y for each time $t_x$; however, the second row of FIG. 10 illustrates that at each time $t_x$, the sample toggles back and forth between the Pb and Pr signals.

Figure 11:
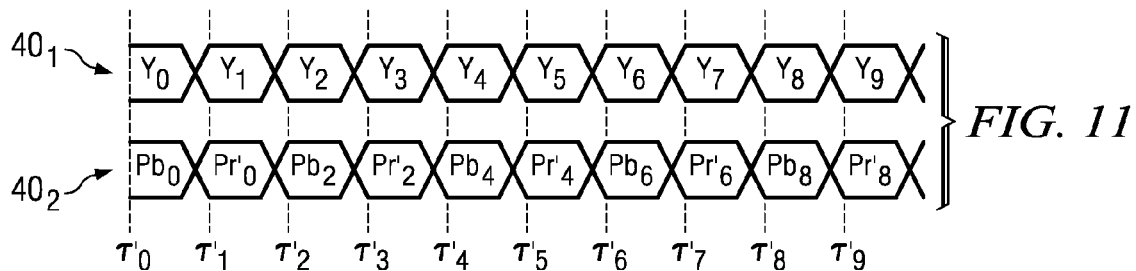
FIG. 11 illustrates a timing diagram of the outputs of filters $40_1$ and $40_2$ when connected to process YPbPr signals and relative to the operation of FIG. 4c.

Continuing with the operation of decoder 14 of FIG. 4c with respect to component signals, note that the bypass signal from controller 34 is used differently as compared to that of FIG. 4b and for sake of distinction is shown as a bypass signal, BP'. Specifically, in FIG. 4c, bypass signal BP' is connected from controller 34 to interpolate/decimate filter $40_1$ and to de-multiplexer and delay unit $42_1$. In regard to the former, when decoder 14 operates in the manner of FIG. 4c, controller 34 asserts bypass BP' and, in response, filter $40_1$ is thereby requested to bypass its function, merely transmitting its input to its output. Thus, the first row from FIG. 10, as provided by the output of ADC $38_1$, is passed to the output of filter $40_1$. To further illustrate this aspect, FIG. 11 illustrates a timing diagram of the outputs of filters $40_1$ and $40_2$ in FIG. 4c, with the first row depicting the output of filter $40_1$. By comparing this first row to the first row of FIG. 10, one skilled in the art will confirm that filter $40_1$ performs the just-described bypass operation in response to the asserted BP' signal. Looking to the second row of FIG. 11, it demonstrates that filter $40_2$ operates in a manner comparable to that described above with respect to SCART signals, although the subscript convention is now changed due to the effective 1× timing of the Pb and Pr signals. In this regard, the Pb signals are unaffected by filter $40_2$, similar to the effect with respect to the B signals in FIG. 4b. However, both the interpolation and decimation operations are performed by filter $40_2$ with respect to the Pr signals. Accordingly, for every instance of the Pr signal followed by a successive instance of Pr (separated in time by a Pb signal), filter $40_2$ interpolates to a value at the midpoint in time between those two values, then decimates those two values and inserts the interpolated value. For example, at time $t'_3$ (the apostrophe due to some delay relative to FIG. 10), an interpolated value of $Pr'_2$ has been determined corresponding to a time $t_2$ that is midway between the time of $t_1$ for $Pr_1$ and $t_3$ for $Pr_3$ from FIG. 10, and the new value of $Pr'_2$ is then inserted in the data stream between Pb values. Other examples in FIG. 11 will be readily appreciated by one skilled in the art.

Figure 12:
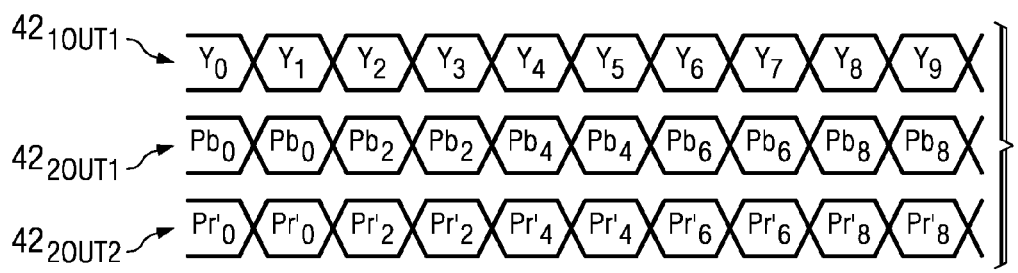
FIG. 12 illustrates a timing diagram of the outputs of units $42_1$ and $42_2$ when connected to process YPbPr signals and relative to the operation of FIG. 4c.

Concluding the discussion with respect to the component signals, Figure 12 illustrates a timing diagram of the outputs of units $42_1$ and $42_2$ of FIG. 4c. Looking to the first row of the Figure, which depicts output $42_{1OUT1}$ of unit $42_1$, recall that controller 34 asserts the bypass signal BP' when component signals are input to interface 30. In response, de-multiplexer and delay unit $42_1$ does not operate to alternate its input to every other output as was the case for SCART and RGB above, but instead it couples its input, with sufficient delay for alignment discussed below, to only its output $42_{1OUT1}$. Thus, output $42_{1OUT1}$ provides sequential values of the converted Y signal, as also shown in partial form in FIG. 4c as $Y_0, Y_1, Y_2, \ldots$ While not shown in FIG. 12, it is also noted that output $42_{1OUT2}$ of unit $42_1$ may be considered a null stream, since only Y inputs are received by unit $42_1$ and they are all connected to output $42_{1OUT1}$. The second and third rows of FIG. 12 illustrate outputs $42_{2OUT1}$ and $42_{2OUT2}$, respectively. In general, these outputs are produced in a manner comparable to the SCART outputs $42_{2OUT1}$ and $42_{2OUT2}$ of FIG. 7; in other words, in a same manner as described above, unit $42_2$ receives successive inputs and delays a second input data value, relative to a first, so that both may be output at a same time at the two respective outputs $42_{2OUT1}$ and $42_{2OUT2}$. For example, by time $t'_2$ of FIG. 11, unit $42_2$ will have received both $Pb_0$ and $Pr'_0$; thus, thereafter, unit $42_2$ outputs $Pb_0$ on output $42_{2OUT1}$ and $Pr'_0$ at the same time on output $42_{2OUT2}$. Accordingly, those values are time-aligned with respect to one another. In addition, however, recall that Pb and Pr have frequency bandwidths less than one-half of that of Y; accordingly, in the preferred embodiment, when unit $42_2$ operates in this manner, it outputs each value for two of the periods for unit $42_1$ outputs the Y value, thereby aligning all three data signals. Thus, as $Y_0$ is provided at output $42_{1OUT1}$, $Pb_0$ is provided at output $42_{2OUT1}$ and $Pr'_0$ is provided at output $42_{2OUT2}$. Moreover, when next $Y_1$ is provided at output $42_{1OUT1}$, again $Pb_0$ is provided at output $42_{2OUT1}$ and $Pr'_0$ is provided at output $42_{2OUT2}$. Thus, only once two values of $Y_x$ have been provided by output $42_{1OUT1}$ are a next value of Y and a time-aligned next set of values of Pb and Pr provided, where again the Pb and Pr values are maintained as outputs for two different values of Y. This process repeats for each of two input values to unit $42_2$, thereby producing the continuing sequences shown in the last two rows of FIG. 12. Lastly, note also that the sequence of FIG. 12 is as desired from the output and is obtained at half that sampling rate as compared to the SCART signals described above, thereby saving power consumption by using the lower reduced clock speed. Alternatively, however, one skilled in the art will readily appreciate that the YPbPr signals also may be processed at the sampling rates provided above for SCART signals.

Having detailed the operation of decoder 14 of a preferred embodiment with respect to component signal inputs, comparisons now may be made between the preferred embodiment and the prior art. As one observation, note the timing diagrams of the prior art approach of FIG. 2 and that of the preferred embodiment of FIG. 12. In both instances, three output signals are provided, one corresponding to each of the three component input analog signals. However, recall that the prior art requires a separate ADC for each of the three inputs; in contrast, as has been shown in FIGS. 4a and 4c, again the preferred embodiment processes multiple different analog signals through a single ADC. For example, ADC $38_2$ processes the different analog signals $Pb_a$ and $Pr_a$. Consequently, also in this implementation, the preferred embodiment again uses less ADCs than the total number of analog video input signals to be decoded. Thus, once more less room is consumed on the integrated circuit die on which these ADCs are formed, thereby reducing complexity and cost as compared to the prior art. Moreover, as how now been demonstrated below, the preferred embodiment approach of decoder 14 may be used for various formats, including SCART, RGB, and component As a result, a single decoder design may be used for numerous applications, including those in both Europe and North America. This considerably reduces the design considerations and costs as compared to approaches that require one decoder device for European applications and another for North American applications.

From the above, it may be appreciated that the preferred embodiments provide a video decoder with different signal types processed by a common ADC. For example, in one illustrated embodiment, one ADC processes two SCART signals and another ADC also processes two SCART signals, thereby halving the number of ADCs required as compared to a prior art approach. In another example, one ADC processes two component signals, whether they are from a simpler component signal format (e.g., RGB) or a more complex format (e.g., YPbPr). As a result of these approaches and benefits, various other benefits have been provided. Moreover, one skilled in the art may ascertain still other benefits as well. Thus, the preferred embodiments include various aspects and advantages as compared to the prior art, and still others will be appreciated by one skilled in the art. Moreover, while the preferred embodiments have been shown by way of example, certain other alternatives have been provided and still others are contemplated. Thus, the preceding discussion and these examples should further demonstrate that while the present embodiments have been described in detail, various substitutions, modifications or alterations could be made to the descriptions set forth above without departing from the inventive scope which is defined by the following claims.

The invention claimed is:

1. A video decoder, comprising:
   an interface for receiving a set of an integer number S of analog input signals at a same time;

circuitry for processing the S analog input signals, comprising an integer number N of analog-to-digital converters for producing a set of the integer number S of digital signals;
  wherein each digital signal in the set of S of digital signals corresponds to a respective different one of the S analog input signals; and
  wherein N is less than S; and
output circuitry, coupled to the circuitry for processing, for providing each digital signal in the set of S of digital signals to a different respective output conductor in a time-aligned order by comprising at least one interpolating filter corresponding to one of the N analog-to-digital converters and operable for interpolating values between successive values corresponding to some but not all of the S digital signals produced by the one of the N analog-to-digital converters.

2. The video decoder of claim 1:
wherein at a first time S equals three and the integer number S of analog input signals consists of a red, green, and blue input signal; and
wherein the number N equals two.

3. The video decoder of claim 2 wherein at a second time S equals four and the integer number S of analog input signals consists of a red, green, blue, and composite input signal.

4. The video decoder of claim 3 wherein at a third time S equals three and the integer number S of analog input signals comprises three component input signals.

5. The video decoder of claim 4 wherein:
during the second time the circuitry for processing samples at a rate of four times that of a frequency of the red, green, blue, and composite input signal input signals; and
during the third time the circuitry for processing samples at a rate of two times that of a frequency of a Y signal in the component signals.

6. The video decoder of claim 4 wherein the output circuitry is further for providing each digital signal in the set of S of digital signals to a different respective output conductor in a time-aligned order.

7. The video decoder of claim 1 wherein the output circuitry is for providing each digital signal in the set of S of digital signals to a different respective output conductor by further comprising decimation circuitry for removing from a data stream values from which an interpolation is determined.

8. The video decoder of claim 1:
wherein at a first time S equals four and the integer number S of analog input signals consists of a red, green, blue, and composite input signal; and
wherein at a second time S equals three and the integer number S of analog input signals comprises three component input signals.

9. The video decoder of claim 8 wherein the output circuitry is further for providing each digital signal in the set of S of digital signals to a different respective output conductor in a time-aligned order.

10. The video decoder of claim 1 wherein the output circuitry is for providing each digital signal in the set of S of digital signals to a different respective output conductor by further comprising decimation circuitry for removing from a data stream values from which an interpolation is determined.

11. The video decoder of claim 10 wherein:
during the second time the circuitry for processing samples at a rate of four times that of a frequency of the red, green, blue, and composite input signal input signals; and
during the third time the circuitry for processing samples at a rate of two times that of a frequency of a Y signal in the component signals.

12. A method of operating a video decoder, comprising:
receiving a set of an integer number S of analog input signals at a same time;
processing the S analog input signals by a step comprising operating an integer number N of analog-to-digital converters for producing a set of the integer number S of digital signals;
  wherein each digital signal in the set of S of digital signals corresponds to a respective different one of the S analog input signals; and
  wherein N is less than S; and
responsive to the processing step, providing each digital signal in the set of S of digital signals to a different respective output conductor in a time-aligned order by interpolating, relative to at least one of the N analog-to-digital converters, between successive values corresponding to some but not all of the S digital signals produced by the at least one of the N analog-to-digital converters.

13. The method of claim 12:
wherein at a first time S equals three and the integer number S of analog input signals consists of a red, green, and blue input signal; and
wherein the number N equals two.

14. The method of claim 13 wherein at a second time S equals four and the integer number S of analog input signals consists of a red, green, blue, and composite input signal.

15. The method of claim 14 wherein at a third time S equals three and the integer number S of analog input signals comprises three component input signals.

16. The method of claim 15 wherein:
during the second time the processing step samples at a rate of four times that of a frequency of the red, green, blue, and composite input signal input signals; and
during the third time the processing step samples at a rate of two times that of a frequency of a Y signal in the component signals.

17. The method of claim 15 wherein the providing step further comprises providing each digital signal in the set of S of digital signals to a different respective output conductor in a time-aligned order.

18. The method of claim 12:
wherein at a first time S equals four and the integer number S of analog input signals consists of a red, green, blue, and composite input signal; and
wherein at a second time S equals three and the integer number S of analog input signals comprises three component input signals.

* * * * *